(12) United States Patent
Templier et al.

(10) Patent No.: US 12,464,871 B2
(45) Date of Patent: Nov. 4, 2025

(54) METHOD FOR MANUFACTURING A COLOUR-CONVERSION OPTOELECTRONIC DEVICE, INCLUDING A STEP OF POLARISING AN ELECTRET LAYER IN A LOCALISED MANNER BY MEANS OF THE UPPER ELECTRODES OF THE DIODES

(71) Applicant: COMMISSARIAT A L'ENERGIE ATOMIQUE ET AUX ENERGIES ALTERNATIVES, Paris (FR)

(72) Inventors: François Templier, Grenoble (FR); Stéphane Altazin, Grenoble (FR); Aurélien Suhm, Grenoble (FR); Jérémy Bilde, Grenoble (FR); Etienne Quesnel, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 30 days.

(21) Appl. No.: 18/823,309

(22) Filed: Sep. 3, 2024

(65) Prior Publication Data
US 2025/0081685 A1 Mar. 6, 2025

(30) Foreign Application Priority Data
Sep. 4, 2023 (FR) ...................... 2309260

(51) Int. Cl.
*H10H 20/851* (2025.01)
*H01L 25/075* (2006.01)
*H10H 20/01* (2025.01)

(52) U.S. Cl.
CPC ..... *H10H 20/8514* (2025.01); *H01L 25/0753* (2013.01); *H10H 20/0361* (2025.01)

(58) Field of Classification Search
CPC ............ H10H 20/8514; H10H 20/0361; H01L 25/0753
See application file for complete search history.

(56) References Cited

U.S. PATENT DOCUMENTS

| | | | |
|---|---|---|---|
| 11,699,777 B2 * | 7/2023 | Vampola | H01L 33/62 |
| | | | 257/98 |
| 2012/0037885 A1 * | 2/2012 | Schardt | H01L 27/156 |
| | | | 257/13 |
| 2016/0190110 A1 | 6/2016 | Gootz et al. | |
| 2022/0154915 A1 | 5/2022 | D'amico et al. | |

* cited by examiner

*Primary Examiner* — Bo B Jang
(74) *Attorney, Agent, or Firm* — Oblon, McClelland, Maier & Neustadt, L.L.P.

(57) ABSTRACT

A method for manufacturing an optoelectronic device including an array of diodes and an array of colour conversion portions includes providing the array of diodes, and the upper electrode layers; depositing a dielectric layer having a substantially zero surface potential; applying a potential difference between an electrode and the first upper electrode layers, resulting in the formation of first patterns with non-zero surface potential in the dielectric layer; and producing the first colour conversion portions, by contacting the dielectric layer with a colloidal solution containing first photoluminescent particles.

12 Claims, 8 Drawing Sheets

METHOD FOR MANUFACTURING A COLOUR-CONVERSION OPTOELECTRONIC DEVICE, INCLUDING A STEP OF POLARISING AN ELECTRET LAYER IN A LOCALISED MANNER BY MEANS OF THE UPPER ELECTRODES OF THE DIODES

TECHNICAL FIELD

The field of the invention is that of methods for manufacturing optoelectronic devices including an array of electroluminescent radiation emission or detection diodes, associated with colour conversion portions. The invention finds an application in particular in display screens and image projectors.

PRIOR ART

Optoelectronic devices exist including an array of identical electroluminescent diodes covered at least partially by colour conversion portions. Such optoelectronic devices can form display screens or image projection systems including an array of luminous pixels of different colours.

In such an optoelectronic device, each luminous pixel includes one or more light-emitting diodes associated with a colour conversion portion. In the aim of obtaining luminous pixels adapted to emit light radiation of different colours, for example blue, green or red, the light-emitting diodes may be adapted to all emit the same light, for example blue, and the green and red pixels include light conversion portions adapted to absorb the incident blue light at least partially, and to emit a green light or a red light in response.

The light-emitting diodes are therefore preferably identical with each other, and emit a light radiation of the same wavelength. They may be formed based on a semiconductor material comprising elements of column III and column V of the periodic table, such as a III-V compound, in particular gallium nitride (GaN), indium gallium nitride (InGaN) or aluminium gallium nitride (AlGaN). They are arranged so as to form a light-emitting diode array having a front face through which the light radiation generated is transmitted.

The light conversion portions may be formed of a bonding array including particles of a photoluminescent material such as yttrium aluminium garnet (YAG) activated by the cerium ion YAG: Ce. The photoluminescent particles may also be quantum dots, i.e. in the form of semiconductor nanocrystals in which the quantum confinement is substantially three-dimensional.

The manufacturing method may include the deposition followed by the structuring of a photoluminescent layer to form first light conversion portions, for example adapted to convert blue to red. These steps are performed again to form second light conversion portions, for example adapted to convert blue to green. However, this method has the drawback of being unsuitable for diode arrays with a small pixel pitch, for example of the order of 5 µm, insofar as problems of aligning or covering the light conversion portions with each other may be present.

Document WO2014/136023 describes another manufacturing method, which uses an electret layer covering the diode array. The method firstly comprises a step of imparting patterns of electric charges on the upper face of a dielectric layer to obtain the electret layer. For this, a polarised AFM (Atomic Force Microscopy) tip is used to inject the electric charges locally. Then, a step of localised deposition of colloidal nanocrystals on the patterns of electric charges is performed. For this, the electret layer is contacted with a colloidal solution containing the nanocrystals, which are naturally deposited on the patterns of electric charges under the effect of a dielectrophoretic force. However, this method has in particular the drawback of having to inject the electric charges sequentially, by moving the AFM tip on the surface of the upper face to form the patterns of electric charges therein.

Document WO2021/023656 describes a similar method, where the patterns of electric charges are defined by a stamping technique, i.e. by contacting, with a dielectric layer intended to form the electret layer, an electrically polarised buffer. The lower face of the buffer is structured to form polarised teeth, which come into contact with the dielectric layer. The electret layer wherein the top face has the patterns of electric charges is thus obtained. Then, the electret layer is contacted with a colloidal solution, the nanocrystals present then being deposited on the patterns of electric charges by dielectrophoresis. However, this method particularly has the drawback of having to position the buffer precisely with respect to the diode array. However, the positioning uncertainty of the buffer with respect to the diode array may become problematic, in particular for diode arrays with a small pixel pitch, for example of the order of 5 µm. Indeed, this positioning uncertainty or imprecision may result in a poor positioning of the light conversion portion with respect to the diodes, and therefore a degradation of the performances of the optoelectronic device.

DISCLOSURE OF THE INVENTION

The aim of the invention is that of at least partially remedying the drawbacks of the prior art, and more particularly that of providing a method for manufacturing an optoelectronic device, where the colour conversion portions are produced in a localised and self-aligned manner on the corresponding diodes, while limiting the risk of misalignment with respect to the diodes.

For this, the subject matter of the invention is a method for manufacturing an optoelectronic device, which includes: an array of diodes, having mutually opposite rear and front faces, the front face being intended to receive or transmit light radiation; and an array of colour conversion portions disposed on the front face, including first colour conversion portions disposed facing diodes referred to as first diodes of the diode array.

The method includes the following steps:
providing an optoelectronic structure including: the diode array; at least one lower electrode layer disposed at the rear face and adapted to polarise the diodes; and upper electrode layers disposed at the front face and adapted to polarise the diodes, including first upper electrode layers adapted to polarise the first diodes and distinct from the other upper electrode layers;
depositing a dielectric layer, of which an upper face opposite the front face has a substantially zero surface potential, covering the diode array and the upper electrode layers;
applying a potential difference between, on one hand, a temporary electrode disposed on the dielectric layer, and, on the other, the first upper electrode layers, resulting in the formation of first patterns with non-zero surface potential in the dielectric layer located only facing the first upper electrode layers; then removing the temporary electrode; and
producing the first colour conversion portions, by contacting the dielectric layer with a first colloidal solution containing first photoluminescent particles, which are deposited on the dielectric layer only facing the first patterns with non-zero surface potential, thus forming the first colour conversion portions.

Some preferred yet non-limiting aspects of this manufacturing method are as follows.

The array of colour conversion portions may include second colour conversion portions, distinct from the first colour conversion portions, and disposed facing diodes referred to as second diodes of the diode array. Furthermore, the optoelectronic structure may include, among the upper electrode layers, second upper electrode layers adapted to polarise the second diodes. The method may then include, after producing the second colour conversion portions, the following steps:

applying a potential difference between, on one hand, a temporary electrode disposed on the dielectric layer, and, on the other, the second upper electrode layers, resulting in the formation of second patterns with non-zero surface potential in the dielectric layer located only facing the second upper electrode layers; then removing the temporary electrode; and producing the second colour conversion portions, by contacting the dielectric layer with a second colloidal solution containing second photoluminescent particles distinct from the first photoluminescent particles, which are deposited on the dielectric layer only facing the second patterns with non-zero surface potential, thus forming the second colour conversion portions.

Each upper electrode layer may entirely cover the diode on top of which it is located.

During the step of applying a potential difference between the temporary electrode and the upper electrode layers, the lower electrode layers may be non-polarised.

During the step of applying a potential difference between the temporary electrode and the upper electrode layers, said lower electrode layers then polarised may be interconnected.

The diodes may be in contact with lower electrode layers, the lower electrode layers being distinct from each other, so as to be able to activate each diode selectively.

The method may include, after producing the colour conversion portions, a step of interconnecting the first and second upper electrode layers.

The method may include, after producing the colour conversion portions, a step of interconnecting all of the upper electrode layers.

The diodes may have mutually identical light radiation emission or absorption properties.

The diodes may be produced based on an organic or inorganic semiconductor compound.

The invention also relates to a method for collectively and simultaneously manufacturing several optoelectronic devices from the same substrate, including the simultaneous implementation of the steps of the method according to any of the preceding features for each optoelectronic device.

Within the scope of the collective manufacturing method, during the step of applying a potential difference between the temporary electrode and the upper electrode layers, the temporary electrode may continuously cover all the diode arrays. Moreover, said upper electrode layers then polarised may be interconnected.

BRIEF DESCRIPTION OF THE DRAWINGS

Other aspects, aims, advantages and features of the invention will become more apparent upon reading the following detailed description of preferred embodiments thereof, given as a non-limiting example, and made with reference to the appended drawings, wherein.

DETAILED DISCLOSURE OF PARTICULAR EMBODIMENTS

In the figures and in the remainder of the description, the same references represent identical or similar elements. In addition, the various elements are not shown to scale so as to promote clarity of the figures. Moreover, the different embodiments and variants are not mutually exclusive and can be combined together. Unless indicated otherwise, the terms "substantially", "approximately", "in the order of" mean within a 10% margin, and preferably within a 5% margin. Moreover, the terms "between . . . and . . . " and equivalents mean that the bounds are included, unless stated otherwise.

The invention relates to a method for manufacturing an optoelectronic device including an array of diodes, of which at least a part of the diodes is covered by colour conversion portions, so as to form an array of luminous pixels of different colours. The diodes may be emitting diodes such that the optoelectronic device may be for example a display screen, or may be detecting diodes such that the optoelectronic device may be an array photodetector. Moreover, the diodes may be organic (OLED) or inorganic (LED) light-emitting diodes, or organic or inorganic photodetectors.

The production of the colour conversion portions is obtained by localised deposition of photoluminescent particles on an electret dielectric layer where patterns of non-zero surface potential are previously defined. As detailed hereinafter, the formation of these surface potentials is performed by means in particular of the upper electrode layers which moreover provide the electric polarisation of the diodes during their activation. As detailed hereinafter, these upper electrode layers may be common for each type of colour pixel and are distinct from one type of colour pixel to the other. On the other hand, once the colour conversion portions are produced, the upper electrode layer may remain common for each type of colour pixel, or may be common for all the colour pixels, or may be rendered distinct for each pixel. Common means that they are interconnected to apply the same electric potential.

As a general rule, an electret layer is a dielectric layer containing electric charges or a quasi-permanent dipolar polarisation. Also, the electret dielectric layer has, on its upper face, a non-zero surface potential. This results in the electret dielectric layer emitting an external electric field in the absence of an applied field. Within the scope of the invention, the upper face of the electret dielectric layer has zones (called patterns) where the surface electric potential is non-zero. Outside these patterns, the surface potential is substantially zero.

Thus, during the production of the colour conversion portions, the upper electrode layers are distinct, and distributed by colour conversion pixel type. Thus, patterns of non-zero surface potential are formed where photoluminescent particles will then naturally be deposited, in a localised manner, by electrophoresis or dielectrophoresis during the formation of the colour conversion portions. Also, the light conversion portions are naturally located facing (i.e. "perpendicular to") the surface potential patterns, and are not located outside these predefined patterns. This method then makes it possible to precisely define the surface potential patterns on the upper face of the electret dielectric layer, even if the diode array has a large size (in particular when it is produced with 200 mm wafer technology) and/or the pixel pitch of the diode array is small (for example of the order of 5 µm).

Thus, for example, in the case of an array of red, green, blue pixels (RGB) where the diodes are identical and all emit the same blue light, during the production of the red colour conversion portions, only the upper electrode layers of the red pixels are activated, whereas the upper electrode layers of the other pixels (green and blue) are not activated. Similarly, during the production of the green colour conversion portions, only the upper electrode layers of the green pixels are activated, whereas the upper electrode layers of the other pixels (red and blue) are not activated.

The colour conversion portions are formed of particles made of at least one photoluminescent material, and preferably nanoparticles of which a maximum dimension is between 0.2 nm and 1000 nm, for example between 0.2 nm and 100 nm, and for example between 1 nm and 30 nm. The size and/or the composition of the photoluminescent particles are chosen according to the desired luminescence wavelength. The particles may be any shape, for example spherical, angular, flattened, elongated, etc.

The photoluminescent particles may be quantum dots, i.e. semiconductor nanocrystals in which the quantum confinement is substantially three-dimensional. The average size of the quantum dots may then be between 0.2 nm and 50 nm, for example between 1 nm and 30 nm. They may also be nanoplatelets, i.e. nanoparticles having an essentially two-dimensional shape. Also, the smallest dimension (thickness) is less than the two other length and width dimensions, preferably by a ratio of at least 1.5.

The photoluminescent particles may in particular be formed of at least one semiconductor compound, which may be chosen, for example from cadmium selenide (CdSe), indium phosphide (InP), indium gallium phosphide (InGaP), cadmium sulphide (CdS), zinc sulphide (ZnS), cadmium oxide (CdO) or zinc oxide (ZnO), cadmium zinc selenide (CdZnSe), zinc selenide (ZnSe) doped for example with copper or manganese, graphene or from other potentially suitable semiconductor materials. The nanoparticles may also have a core/shell type structure, such as CdSe/ZnS, CdSe/CdS, CdSe/CdS/ZnS, PbSe/PbS, CdTe/CdSe, CdSe/ZnTe, InP/ZnS or other. The particles may also have a perovskite crystalline structure including atoms such as those listed for nanoparticles but also Cs, Mn, Br.

Moreover, the light conversion portions are adapted to convert at least partially an incident light radiation of a first wavelength $\lambda_1$ into a luminescence light radiation of a greater wavelength $\lambda_2$. By way of illustration, they may be adapted to absorb blue light, i.e. the wavelength of which is between approximately 440 nm and 490 nm, and to emit in green, i.e. at a wavelength between approximately 495 nm and 560 nm, or in red, i.e. at a wavelength between 600 nm and 650 nm. Wavelength means here the wavelength at which the emission spectrum has an intensity peak.

Purely by way of illustration, the diodes may be emitting and have an emission spectrum in the visible or infrared (for example NIR or SWIR), or even ultraviolet (200-400 nm) ranges. In the case of an emitting diode array, the incident light radiation is the radiation emitted by the diodes, whereas in the case of photodiodes, it consists of the light radiation from an external environment and aimed at the photodiodes. In the latter case, the diodes are adapted to absorb incident light radiations of different lengths all contained in the same predefined absorption spectrum.

FIGS. 1A to 1M illustrate different steps of a method for manufacturing an optoelectronic device 1 according to an embodiment. In this example, the optoelectronic device 1 includes an array of RGB (red, green, blue) type luminous pixels. Each pixel is formed of at least one light-emitting diode (here one diode per pixel). Alternatively, the optoelectronic device 1 could include an array of luminous pixels of other types, for example of RGB-IR type (IR for infrared). Also alternatively, the diodes may be photodiodes.

An orthogonal three-dimensional direct reference frame XYZ is defined here and for the following description, where the X and Y axes form a main plane wherein a control substrate 10 extends, and where the Z axis is oriented along the thickness of the diode array in the direction of the front face. The terms 'lower' and 'upper' are defined with respect to an increasing positioning along the direction +Z.

Figure 1A:
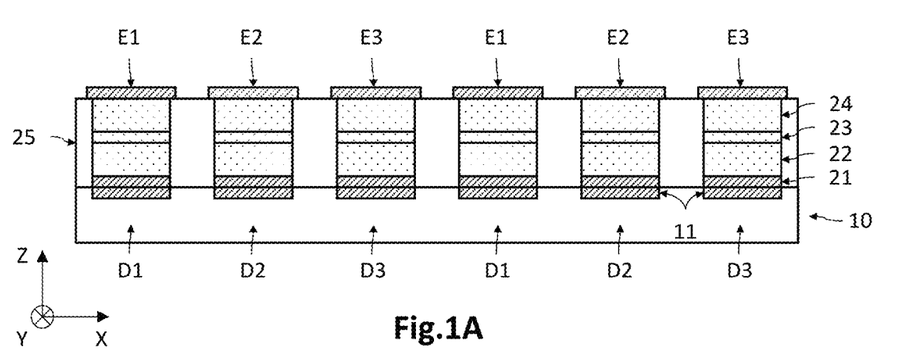
FIGS. 1A to 1M illustrate different steps of a method for manufacturing an optoelectronic device according to an embodiment, where the electret dielectric layer is polarised locally by means of upper electrode layers providing the electric polarisation of the diodes during their activation.

With reference to FIG. 1A, the light-emitting diode array is provided. In this example, the diodes are divided into three types annotated D1, D2, D3, according to the type of luminous pixel to which they belong, for example here blue pixels for the diodes D1, red pixels for the diodes D2, and green pixels for the diodes D3. The diodes rest here on a control substrate 10, and are electrically polarised here by one or more lower electrode layers 11 and by upper electrode layers E1, E2, E3. Other configurations are possible, in particular in the case where the control substrate 10 is electrically conductive. The diode array has a rear face, whereby it is assembled and connected to the control substrate 10, and a front face, opposite the rear face, which is intended to receive or transmit a light radiation. In this example where the diodes are emitting, the front face transmits the light radiation emitted by the diodes.

In this example, the control substrate 10 carries out several functions: mechanical support of the diode array, electric polarisation of the upper electrode layers E1, E2 during the steps of producing the light conversion portions P1, P2, and electric polarisation of the diodes D1, D2, D3 during the operation of the optoelectronic device. It includes here a CMOS type control circuit, and has electrical connection pads 11 which are flush with the upper face and come into contact with lower electrode layers 21 of the diodes D1, D2, D3. These lower electrode layers 21 are here mutually distinct layers, in that each lower electrode layer 21 of a diode is physically distinct from that of the adjacent diode. This configuration is described in detail in document WO2017/194845 A1.

The diodes D1, D2, D3 are here inorganic light-emitting diodes. They may be produced conventionally, for example by epitaxy of semiconductor layers from a growth substrate, then by transferring on the control substrate 10. Each diode D1, D2, D3 may be formed of a stack of: a lower semiconductor portion 22 (oriented towards the control substrate 10) doped with a first type of conductivity, for example p type, in electrical contact with a lower electrode layer 21; an active zone 23 where the light radiation of the light-emitting diode is emitted; and an upper semiconductor portion 24 doped with a second type of conductivity, for example n type, in electrical contact with an upper electrode layer E1, E2 or E3. The diodes D1, D2, D3 may be produced from the same semiconductor compound, for example based on a III-V compound such as GaN, InGaN, AlGaN.

Preferably, the diodes D1, D2, D3 are structurally identical, such that the light radiation emitted is identical from one diode to the other in terms of wavelength. In this example, the diodes D1, D2, D3 are adapted to emit a light radiation in the blue range, i.e. the emission spectrum of which has an intensity peak at a wavelength between approximately 440 nm and 490 nm.

Figure 1B:
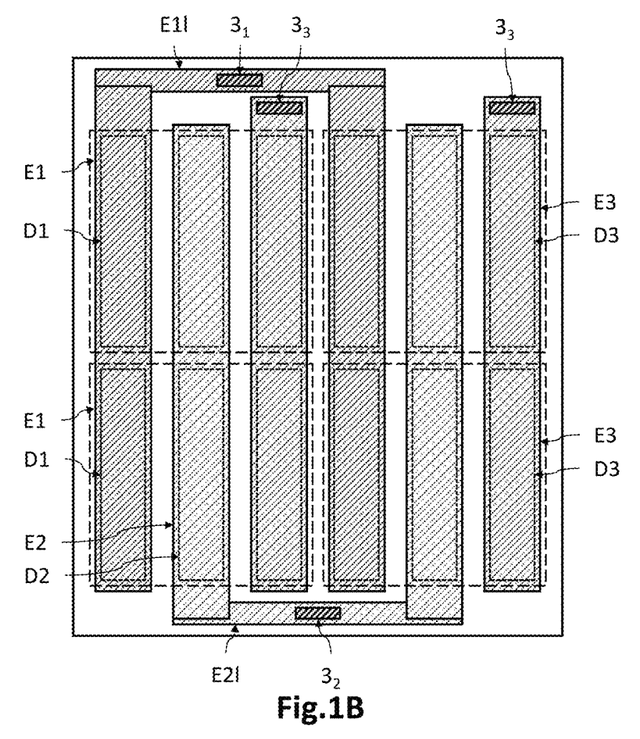

FIG. 1B is a top view of the diode array illustrated in FIG. 1A. This is obviously an example because other configurations are possible. Here, each RGB pixel includes three diodes D1, D2, D3. The upper electrode layers E1 intended to polarise the diodes D1 extend here along several adjacent diodes D1. The same applies for the upper electrode layers E2 intended to polarise the diodes D2 and for the upper conductors intended to polarise the diodes D3. Preferably, the upper electrode layers E1 are interconnected by a lateral conductive strip E1l. The upper electrode layers E2 are also interconnected by a lateral conductive strip E2l. The upper electrode layers are connected to the control substrate by connection pads 3 (pad $3_1$ for the electrode layers E1, pad $3_2$ for the layers E2, etc.), for example by conductive vias which extend through the dielectric filling material 25 surrounding the diodes D1, D2, D3.

Preferably, the electrode layers E1 cover the diodes D1 entirely in the plane XY, as the electrode layers E2 cover the diodes D2 entirely, and the electrode layers E3 cover the diodes D3 entirely. Obviously, the electrode layers of the same type (e.g. E1) do not extend facing the diodes of the other types (e.g. D2 and D3).

The lower and upper electrode layers are made of an electrically conductive material. The lower electrode layers 21 may be made of at least one metallic material chosen from Ti, Ni, Pt, Sn, Au, Ag, Al, Pd, W, Pb, Cu, AuSn, TiSn or an alloy of these elements. They may preferably be reflective to the light radiation emitted by the diodes, and may thus be made based on Ag. Moreover, the material of the upper electrode layers E1, E2, E3 is at least partially transparent to the light radiation emitted by the diodes, and may be for example ITO (indium tin oxide), or semi-transparent fine metallic materials (e.g. Ag).

Figure 1C:
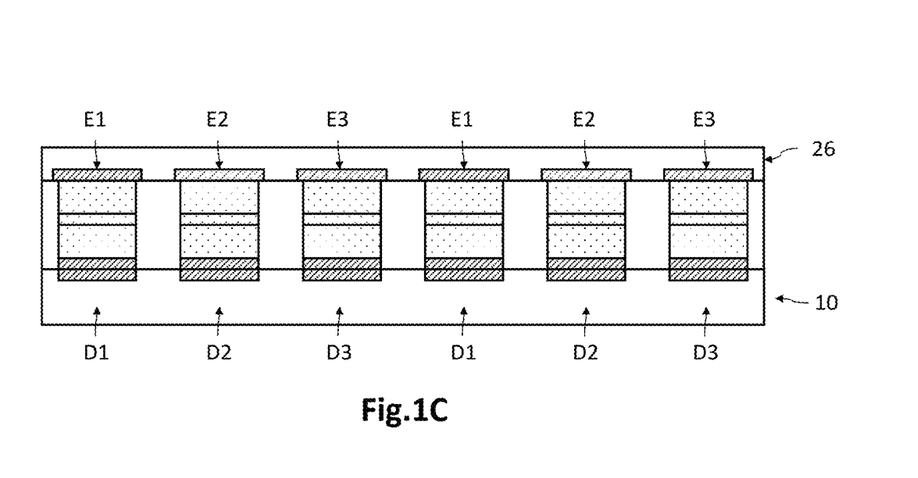

With reference to FIG. 1C, a dielectric layer 26 intended to form the electret layer is then produced. The dielectric layer 26 covers the diode array, and therefore the upper electrode layers E1, E2 and E3. It initially has a substantially zero surface potential, such that there are no undesired patterns of non-zero surface potential. The dielectric layer 26 is made of a dielectric material, for example inorganic, such as a silicon oxide, nitride or oxynitride, for example $SiO_2$, $Si_3N_4$, $Al_2O_3$ (in particular in the case of OLEDs), inter alia. It may have a thickness of the order of some hundreds of nanometres, for example approximately 400 nm.

Figure 1D:
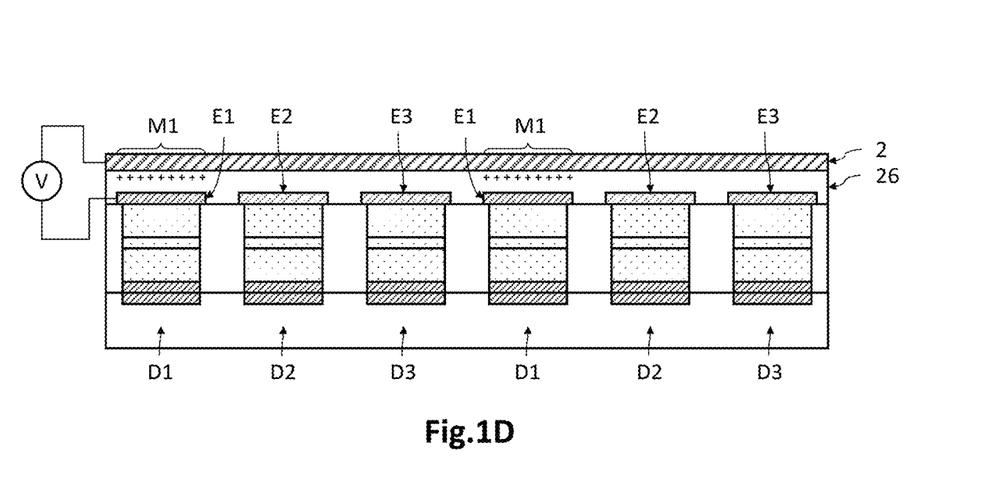

With reference to FIG. 1D, surface potential patterns M1 are produced, by localised electrostatic polarisation of the dielectric layer 26, which then forms the electret dielectric layer. For this, a temporary electrode 2 is placed on top of the dielectric layer 26, and preferably in contact with it. Note that this temporary electrode 2 may be formed of a rigid conductive plate, or of a layer of an electrically conductive liquid (metal, electrolyte, etc.), inter alia. A potential difference is applied between the temporary electrode 2, on one hand, and only the upper electrode layers E1, on the other. This potential difference may be of the order of some tens or hundreds of volts, for example between 10V and 200V. During this step, only the upper electrode layers E1 are activated, and not the other upper electrode layers E2 and E3. Non-zero surface potential patterns M1 are formed in a localised manner at the upper face of the electret dielectric layer 26, facing only the diodes D1, and not facing the diodes D2 and D3. The temporary electrode 2 is then removed. Note that, during this step, the lower electrode layers 21 remain non-polarised, such that the diodes D1, D2, D3 are inactive.

Figure 1E:
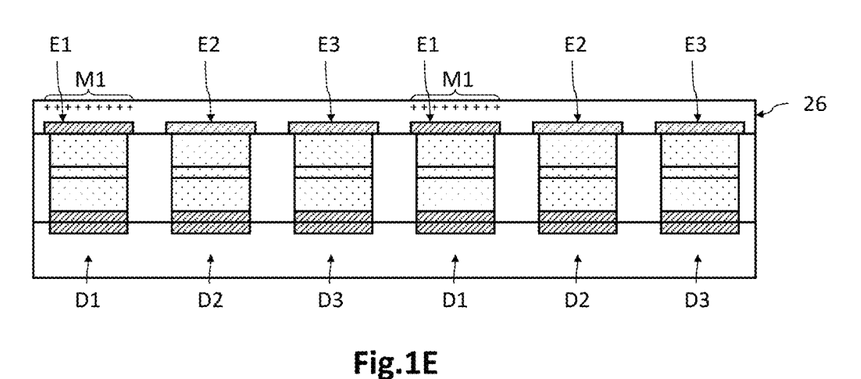
Figure 1F:
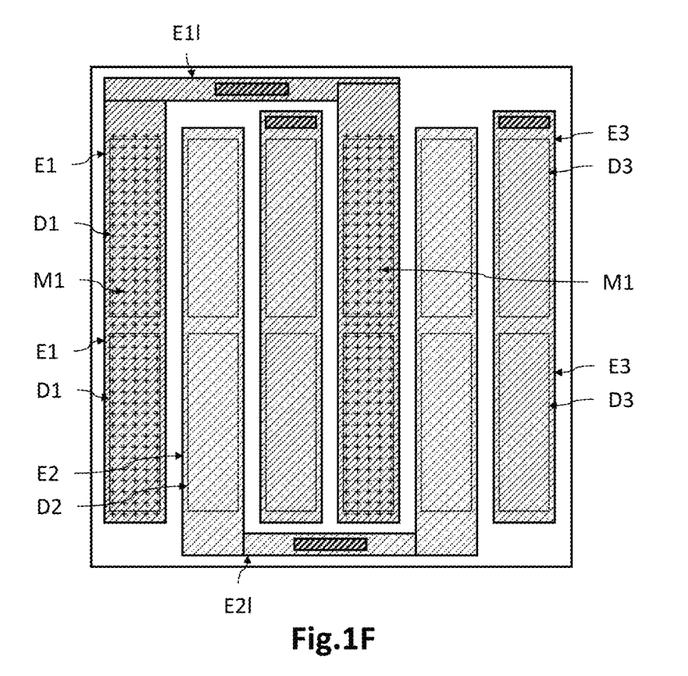

FIGS. 1E and 1F illustrate the structure obtained. The surface potential patterns M1 are present only facing the upper electrode layers E1. In other words, the electret dielectric layer 26 has a substantially zero surface potential everywhere, except facing the upper electrode layers E1. Note that, in this example, the surface potential patterns M1 may not extend facing the lateral conductive strip E1l for connecting the upper electrode layers E1.

Figure 1G:
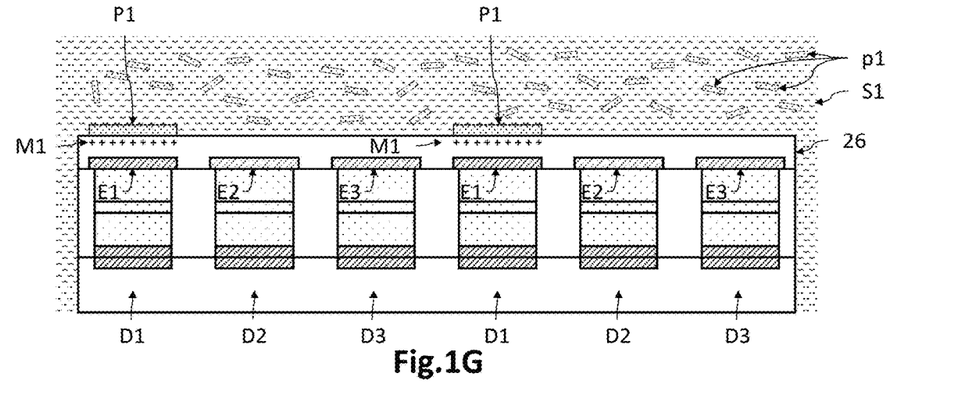

With reference to FIG. 1G, the first colour conversion portions P1 are produced, by localised deposition of first photoluminescent particles p1 on the electret dielectric layer 26, facing only the surface potential patterns M1. For this, a procedure similar to that described in documents WO2014/136023 and WO2021/023656 is followed. Thus, a colloidal solution S1 containing the first photoluminescent particles p1 is contacted with the upper face of the electret dielectric layer 26. The photoluminescent particles p1 are adapted to convert blue light into a red light. The entire stack may thus be immersed in the colloidal solution S1, or a drop of such a solution deposited on the electret dielectric layer 26. On account of a non-zero surface potential located in the patterns M1, a non-uniform electric field is generated which triggers a localised deposition of the photoluminescent particles p1 by electrophoresis or dielectrophoresis. Also, the photoluminescent particles p1 are essentially deposited facing the first patterns M1 (and therefore facing the diodes D1), and substantially not outside the patterns M1 (i.e. not facing the diodes D2 and D3). The contacting time of the colloidal solution S1 on the electret dielectric layer 26 is dependent in particular on the quality of photoluminescent particles p1 to be deposited and therefore the desired thickness of the colour conversion portions P1, as well as the value of the surface potential. For example, the thickness of the colour conversion portions P1 may be of the order of some hundreds of nanometres, for example equal to approximately 400 nm. The colloidal solution S1 is then removed and the electret dielectric layer may be dried.

Figure 1H:
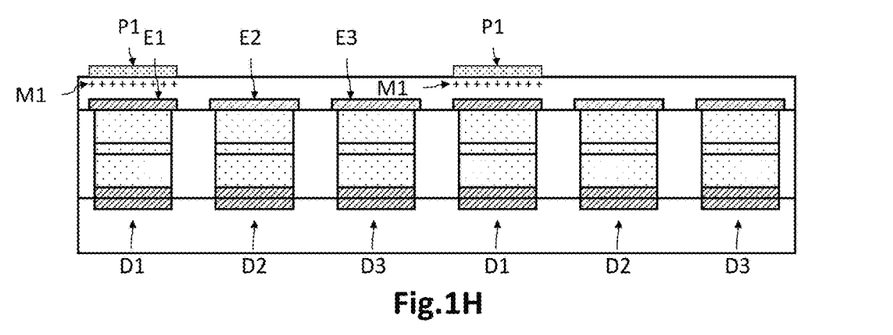
Figure 1I:
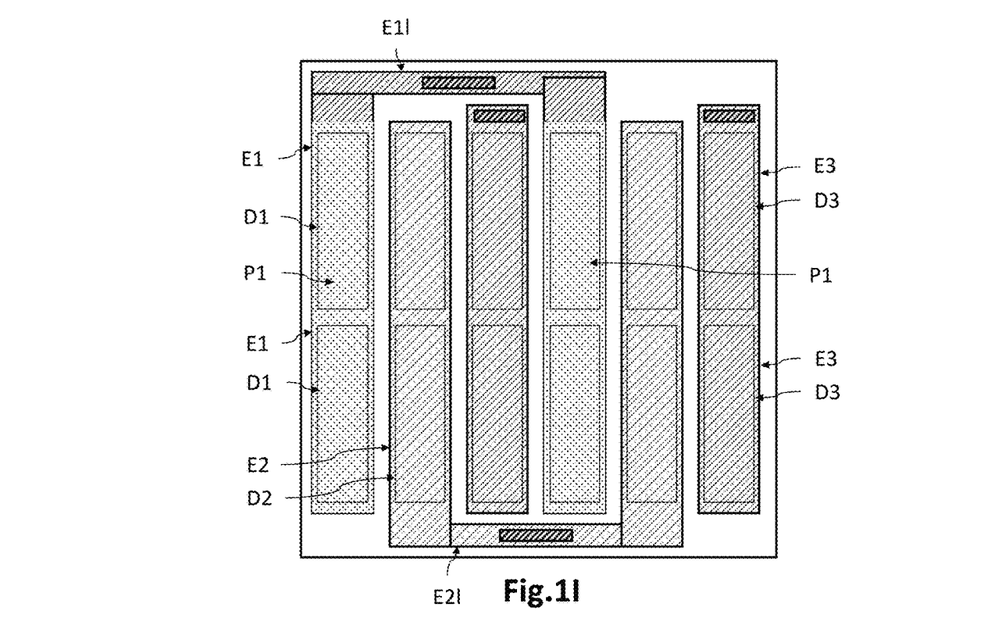

FIGS. 1H and 1I illustrate the structure obtained. The colour conversion portions P1 are present only facing the upper electrode layers E1 and therefore the diodes D1. They do not extend facing the diodes D2 and D3. Red pixels are thus obtained for which the relative positioning of the colour conversion portions P1 with respect to the diodes D1 is optimal. The portions P1 do not extend facing the diodes D2 and D3, and advantageously cover the diodes D1 entirely in the plane XY. Note that, here, the colour conversion portions P1 form distinct pads, the same pad extending however facing several adjacent diodes D1. A thin layer encapsulation (e.g. in $Al_2O_3$) of the colour conversion portions P1 may be performed.

The preceding steps may then be repeated to produce the colour conversion portions P2 located facing the diodes D2, here forming green pixels. Indeed, the colour conversion portions P1 are adapted here to convert a blue light (wavelength between approximately 440 nm and 490 nm) into a red light (wavelength between 600 nm and 650 nm). On the other hand, the colour conversion portions P2 are adapted here to convert the blue light into a green light (wavelength between approximately 495 nm and 560 nm).

Figure 1J:
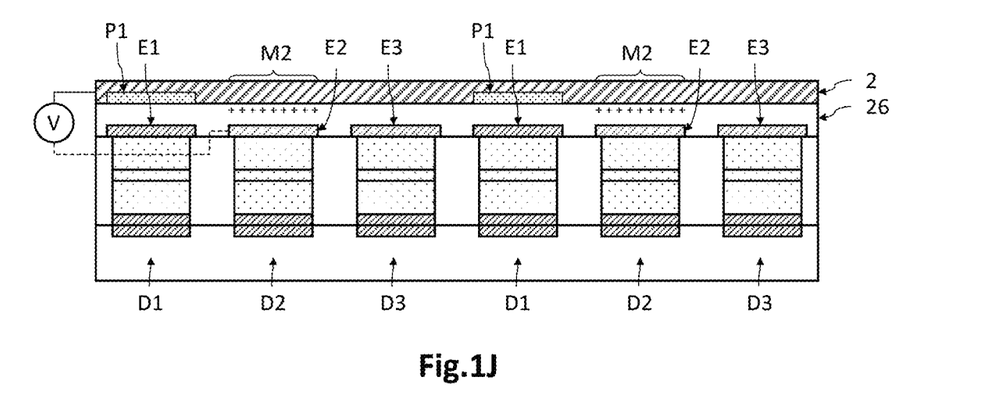

With reference to FIG. 1J, surface potential patterns M2 are produced, by localised electrostatic polarisation of the electret dielectric layer 26. For this, a temporary electrode 2 is again placed on top of the electret dielectric layer 26, and preferably in contact with it. In this example, this temporary electrode 2 is a layer of a liquid metal (or an electrolyte), but it may obviously consist of a rigid conductive plate. A potential difference is applied between the temporary electrode 2, on one hand, and only the upper electrode layers E2, on the other. This potential difference may be for example between 10V and 200V. During this step, only the upper electrode layers E2 are activated, and not the other upper electrode layers E1 and E3. Non-zero surface potential patterns M2 are formed in a localised manner at the upper face of the electret dielectric layer 26, facing only the diodes D2, and not facing the diodes D1 and D3. The temporary electrode is then removed.

Figure 1K:
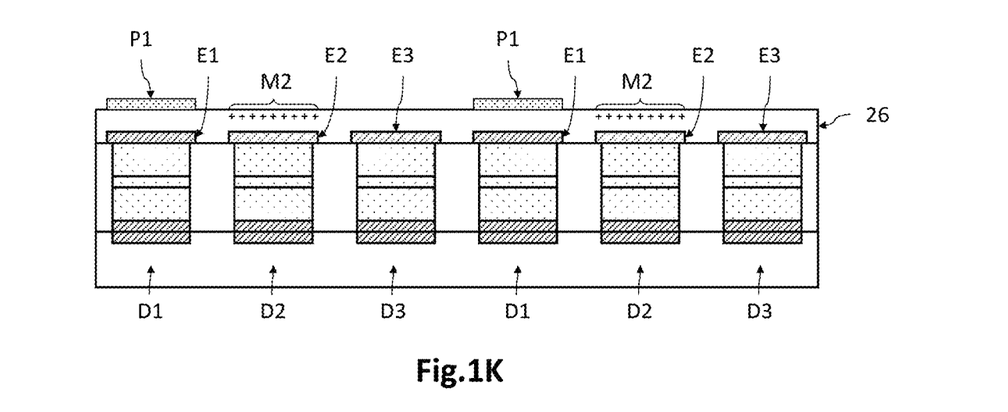

FIG. 1K illustrates the structure obtained, where the electret dielectric layer 26 includes only the surface potential patterns M2. Indeed, the patterns M1 may have disappeared after a predefined time, or may have been removed (e.g. during a cleaning bath). They may also be present but be screened by the opposite pads P1. The surface potential patterns M2 are present only facing the upper electrode layers E2. In this example, the electret dielectric layer 26 has a substantially zero surface potential everywhere, except facing the upper electrode layers E2. Note that, in this example, the surface potential patterns M2 do not extend facing the lateral conductive strip E2*l* for connecting the upper electrode layers E2, insofar as the temporary electrode 2 has not been disposed on top of it.

Figure 1L:
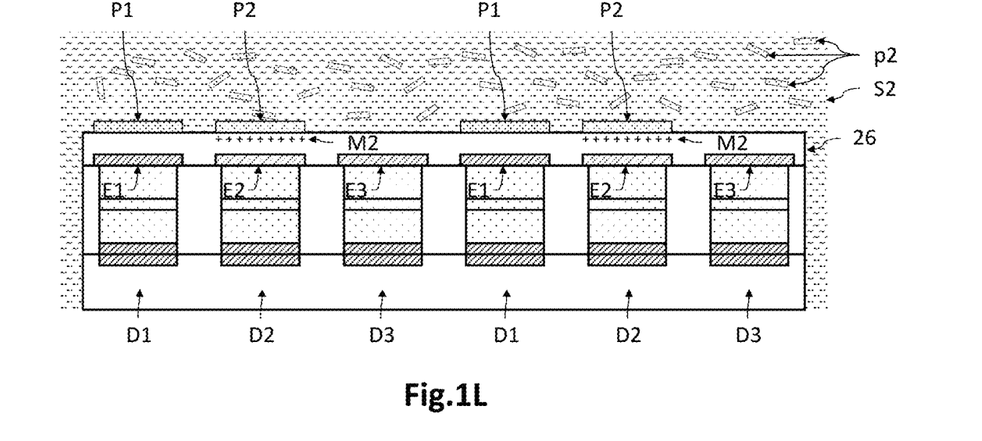

With reference to FIG. 1L, the colour conversion portions P2 are produced, by localised deposition of second photoluminescent particles p2 on the electret dielectric layer 26, facing only the surface potential patterns M2. For this, the procedure is as above, contacting a colloidal solution S2 containing the photoluminescent particles p2 with the upper face of the electret dielectric layer 26. The photoluminescent particles p2 are different from the particles p1 in that they are adapted to convert blue light into a green light. The entire stack may thus be immersed in the colloidal solution S2, or a drop of such a solution deposited on the electret dielectric layer. On account of a non-zero surface potential located in the surface potential patterns M2, a non-uniform electric field is generated which triggers a localised deposition of the photoluminescent particles p2 by electrophoresis or dielectrophoresis. Also, the photoluminescent particles p2 are essentially deposited facing the patterns M2 (and therefore facing the diodes D2), and substantially not outside the patterns M2 (i.e. not facing the diodes D1 and D3). The contacting time of the colloidal solution S2 on the electret dielectric layer 26 is dependent in particular on the quality of photoluminescent particles p2 to be deposited and therefore the desired thickness of the colour conversion portions P2. For example, the thickness of the colour conversion portions P2 may be of the order of some hundreds of nanometres, for example equal to approximately 400 nm. The colloidal solution S2 is then removed and the electret dielectric layer 26 may be dried. An encapsulation layer may be deposited.

Figure 1M:
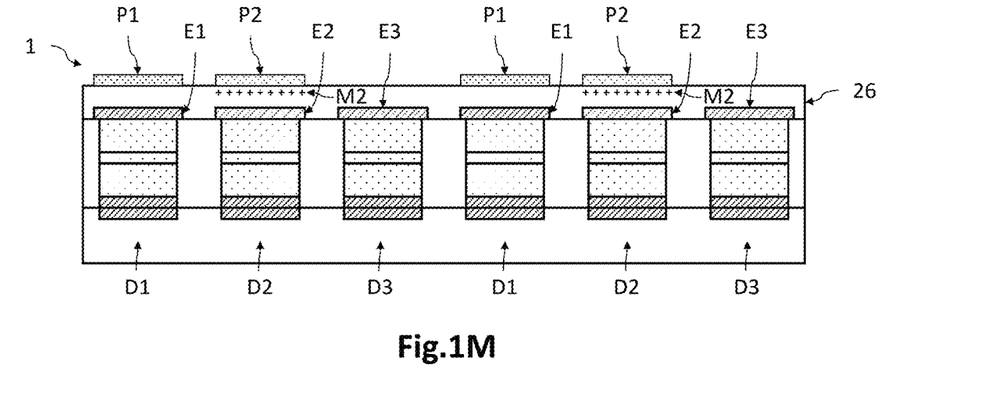

FIG. 1M illustrates the optoelectronic device 1 obtained. The colour conversion portions P1 are present only facing the diodes D1 and define red pixels; the colour conversion portions P2 are located only facing the diodes D2 and define green pixels. The diodes D3 are here not covered by colour conversion portions, thus forming blue pixels. An RGB pixel array device is obtained, wherein the colour conversion portions P1, P2 have been deposited in a localised and self-aligned manner facing the desired diodes, by electrophoresis or dielectrophoresis on the electret dielectric layer 26 in which the localised polarisation has been obtained using the upper electrode layers E1, E2 for polarising the diodes. Thus, it was not necessary to produce upper electrodes specifically for producing the light conversion portions, which are different from the upper diode polarisation electrodes during the operation of the optoelectronic device 1.

Therefore, this avoids having to use a step of localised injection of electric charges in a dielectric layer initially without electric charges, by means of an AFM tip or a conductive buffer. Also, the method is fast and production of the light conversion portions is spatially precise, even in the context of an array of diodes made of substrate of large dimension (for example 200 mm) and/or in which the pixel pitch is very small (for example 5 μm).

Figure 2A:
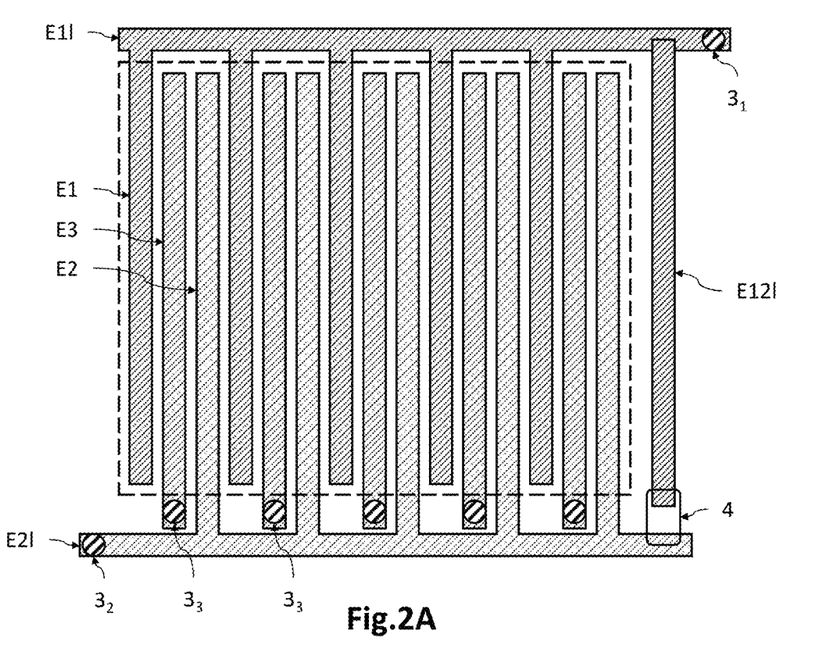
FIG. 2A is a schematic and partial top view of an optoelectronic device according to another embodiment, where the upper electrode layers of the diodes of type D1 are interconnected at the scale of the optoelectronic device, like the upper electrode layers of the diodes of type D2.

FIG. 2A is a top view of an optoelectronic device 1 according to a variant of FIG. 1B. The emitting surface of the optoelectronic device 1 is delimited by dotted lines.

Here, each upper electrode layer E1 of the different pixels is connected electrically to the same connection pad $3_1$ by a lateral conductive strip E1*l* which extends on the edge of the emitting surface. This connection pad $3_1$ may be a conductive via which passes through the dielectric filling layer 25 of the optoelectronic structure to come into contact with a conductive pad 11 of the control substrate 10 (see FIG. 1A). Similarly, each upper electrode layer E2 is connected electrically to the same connection pad $3_2$ by a lateral conductive strip E2*l*. This connection pad $3_2$ may also be a conductive via connected to the control substrate 10.

Furthermore, in this example, each upper electrode layer E3 comes into contact with a conductive via $3_3$ connected to the control substrate 10. Here, the diodes D3 are not covered by light conversion portions insofar as the pixels are here blue pixels.

Thus, during the step of localised and self-aligned deposition of the photoluminescent particles p1, the upper electrode layers E1 are all interconnected and polarised simultaneously, whereas the upper electrode layers E2 and E3 are non-polarised. And during the step of localised deposition of the photoluminescent particles p2, the upper electrode layers E2 are all interconnected and polarised simultaneously, whereas the upper electrode layers E1 and E3 are non-polarised.

Finally, at the end of the manufacture of the optoelectronic device 1, the upper electrode layers E1 and E2 may be interconnected to form a common upper electrode for the diodes D1 and D2. This may be performed by means of a lateral conductive strip E12*l*, which extends here from the lateral conductive strip E1*l* of the layers E1 in the direction of a lateral conductive strip E2*l* of the layers E2. A conductive pad 4 (dotted line) may then be deposited to connect the interconnection lateral conductive strip E12*l* to the lateral conductive strip E2*l*. This may consist of a conductive paste deposited using an ink jet type technique. Thus, the upper electrode layers E1 and E2 form a single interdigital upper electrode which may be brought to an electric potential, during the activation of the diodes D1 and D2. The selective activation of the diodes D1 and D2 may then be performed to polarising a particular lower electrode layer 21.

Note moreover that the upper electrode layers E3 may also be connected to the upper electrode layers E1 and E2, so as to form a single interdigital common upper electrode. Different conventional techniques may be used (deposition of conductive pads to provide interconnection, laser shot, etc.).

Figure 2B:
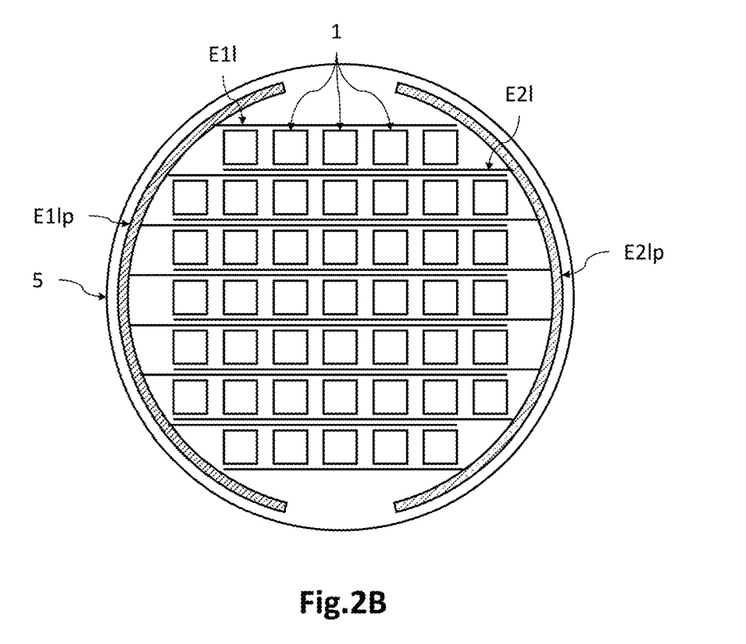
FIG. 2B is a schematic and partial top view of several optoelectronic devices according to another embodiment, manufactured collectively from the same substrate (wafer), where the upper electrode layers of the diodes of a first type of luminous pixel are interconnected at the scale of the substrate, like the upper electrode layers of the diodes of a second type of luminous pixel.

FIG. 2B is a top view of several identical optoelectronic devices 1 according to an alternative embodiment, which illustrates a way to connect the lateral strips to peripheral polarising strips.

In this example, the method relates to the collective and simultaneous manufacture of identical optoelectronic devices 1, on the scale of the same substrate 5 (or wafer) of large dimension, for example having a diameter of 200 or 300 mm.

Here, during the production of the colour conversion portions P1, the upper electrode layers E1 are all interconnected and are polarised together during the step of FIG. 1D. Thus, the same lateral conductive strip E1*l* extends along several adjacent optoelectronic devices (see FIG. 2A), and comes into contact with a main lateral conductive strip E1*lp* located on the edge of the substrate. Note that the temporary electrode 2 extends, preferably, so as to continuously cover all the diode arrays.

Similarly, during the production of the colour conversion portions P2, the upper electrode layers E2 are all interconnected and are polarised together during the step of FIG. 1J. For this, the same lateral conductive strip E2*l* extends along several adjacent optoelectronic devices (see FIG. 2A), and comes into contact with a main lateral conductive strip E2*lp* located on the edge of the substrate.

At the end of the manufacturing method, the substrate 5 is cut to individualize the optoelectronic devices 1.

Also, the manufacturing method makes it possible to produce the colour conversion portions P1, P2 by localised and self-aligned deposition of the photoluminescent particles with respect to the desired diodes, at the scale of the substrate 5.

FIGS. 3A to 3D illustrate different steps of a method for manufacturing an optoelectronic device 1 according to another embodiment. Here, the optoelectronic device 1 differs from that of FIG. 1A and following essentially in that the diodes D1, D2, D3 are organic light-emitting diodes, here in top emission. The optoelectronic device may thus be an OLED screen having a high resolution (small pixels) and a high brightness linked with a substantial quantum efficiency. In this example, there will be a blue-coloured OLED emitting layer, deposited on all the pixels, and the colouration will be performed by selective deposition of converters on the green and red pixels, respectively.

Figure 3A:
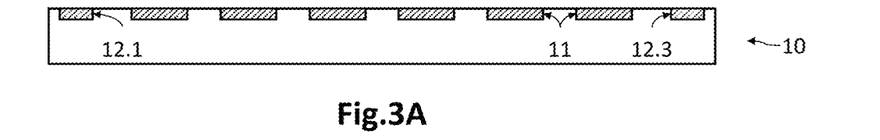
FIGS. 3A to 3D illustrate different steps of a method for manufacturing an optoelectronic device according to another embodiment, where the diodes are organic light-emitting diodes.

With reference to FIG. 3A, a control substrate 10 (CMOS) having connection pads 11 flush with the upper face is provided. These connection pads 11 form lower electrode layers, on one hand, and others 12.1, 12.2 (not shown), 12.3 are intended to provide the electric polarisation of the upper electrode layers E1, E2, E3.

Figure 3B:
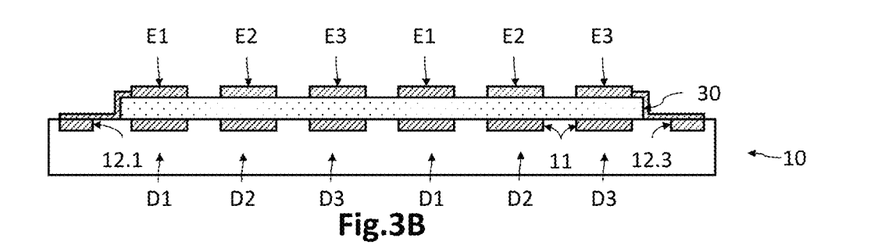

With reference to FIG. 3B, a stack 30 of organic semiconductor layers is then produced, which extends along the control substrate 10 and covers the lower electrode layers 11. Conventionally, it consists of a stack of an HTL layer, emission layers, and an ETL layer. Then upper electrode layers E1, E2 and E3 are produced on the organic semiconductor stack 30. The upper electrode layers E1 are connected here to the same connection pad 12.1, like the upper electrode layers E2 to a connection pad 12.2 (not shown).

Figure 3C:
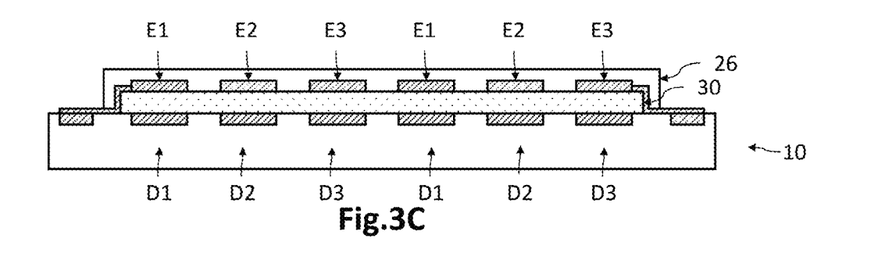

With reference to FIG. 3C, a thin-film encapsulation (TFE) layer 26 is then deposited, which covers the organic semiconductor stack 30 and the upper electrode layers E1, E2 and E3. This TFE layer 26 is made of a dielectric material, and is intended to form the electret dielectric layer. Note that the TFE layer may serve as electret according to a variant. In the general case, there is the TFE layer then an electret on top.

Figure 3D:
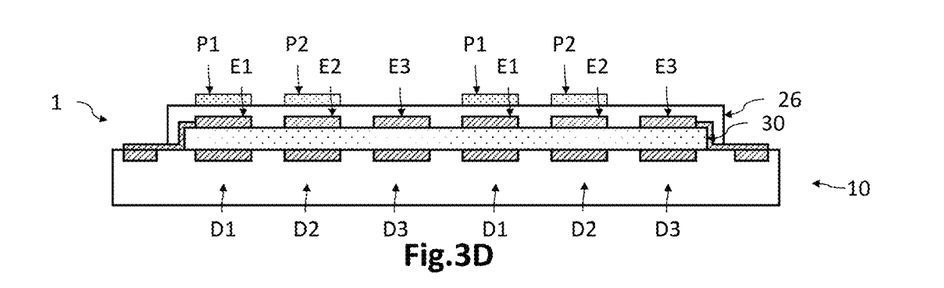

With reference to FIG. 3D, the colour conversion pads P1 and P2 are then produced, which are located facing, respectively, the upper electrode layers E1 and E2. These colour conversion pads are produced as described above with reference to FIG. 1A and following. Thus, an optoelectronic device with organic diodes is obtained, which may have a high resolution, with colour conversion pads P1 and P2 made in a localised and self-aligned manner by means of the upper electrode layers E1 and E2.

Particular embodiments have just been described. Various variants and modifications will become apparent to a person skilled in the art.

The invention claimed is:

1. A method for manufacturing an optoelectronic device, which includes:
    an array of diodes, having mutually opposite rear and front faces, the front face being configured to receive or transmit light radiation;
    an array of colour conversion portions disposed on the front face, including first colour conversion portions disposed facing first diodes of the array of diodes;
    the method including the following steps:
    providing an optoelectronic structure including:
        the array of first diodes;
        at least one lower electrode layer disposed at the rear face and configured to polarise the diodes; and
        upper electrode layers disposed at the front face and configured to polarise corresponding ones of the diodes, including first upper electrode layers configured to polarise the first diodes and distinct from other ones of the upper electrode layers;
    depositing a dielectric layer, of which an upper face opposite the front face has a substantially zero surface potential, covering the array of diodes and the upper electrode layers;
    applying a potential difference between a first temporary electrode disposed on the dielectric layer and the first upper electrode layers, resulting in formation of first patterns with non-zero surface potential in the dielectric layer located only facing the first upper electrode layers; then removing the first temporary electrode; and
    producing the first colour conversion portions, by contacting the dielectric layer with a first colloidal solution containing first photoluminescent particles, which are deposited on the dielectric layer only facing the first patterns with non-zero surface potential, thus forming the first colour conversion portions.

2. The method according to claim 1,
    the array of colour conversion portions including second colour conversion portions, distinct from the first colour conversion portions, and disposed facing second diodes of the array of diodes; and the optoelectronic structure including, among the upper electrode layers, second upper electrode layers configured to polarise the second diodes;

the method comprising, after producing the second colour conversion portions:

applying a potential difference between a second temporary electrode disposed on the dielectric layer and the second upper electrode layers, resulting in formation of second patterns with non-zero surface potential in the dielectric layer located only facing the second upper electrode layers; then removing the second temporary electrode;

producing the second colour conversion portions, by contacting the dielectric layer with a second colloidal solution containing second photoluminescent particles distinct from the first photoluminescent particles, which are deposited on the dielectric layer only facing the second patterns with non-zero surface potential, thus forming the second colour conversion portions.

3. The method according to claim 1, wherein each first upper electrode layer entirely covers a corresponding first diode on top of which it is located.

4. The method according to claim 1, wherein, during applying a potential difference between the first temporary electrode and the first upper electrode layers, the at least one lower electrode layer is non-polarised.

5. The method according to claim 1, wherein, the at least one lower electrode layer comprises a plurality of lower electrode layers and, during applying a potential difference between the first temporary electrode and the first upper electrode layers, the plurality of lower electrode layers are then polarised and interconnected.

6. The method according to claim 1, wherein the at least one lower electrode layer comprises a plurality of lower electrode layers and the first diodes are in contact with corresponding ones of the plurality of lower electrode layers, the corresponding ones of the plurality of lower electrode layers being distinct from each other, so as to be able to activate each first diode selectively.

7. The method according to claim 1, comprising, after producing the first colour conversion portions, interconnecting the first upper electrode layers.

8. The method according to claim 1, comprising, after producing the first colour conversion portions, interconnecting all of the upper electrode layers.

9. The method according to claim 1, wherein the first diodes have mutually identical light radiation emission or absorption properties.

10. The method according to claim 1, wherein the first diodes are produced based on an organic or inorganic semiconductor compound.

11. A method for collectively and simultaneously manufacturing several optoelectronic devices from a same substrate, comprising simultaneous implementation of the method according to claim 1 for each optoelectronic device.

12. The method according to claim 11, wherein, during applying the potential difference between the first temporary electrode and the first upper electrode layers, the first temporary electrode continuously covers all the arrays of diodes, and wherein the lower electrode layers are then polarised and interconnected.

* * * * *